US008604762B2

(12) United States Patent
Bakkaloglu et al.

(10) Patent No.: US 8,604,762 B2
(45) Date of Patent: Dec. 10, 2013

(54) LOW NOISE, LOW DROPOUT REGULATORS

(75) Inventors: Bertan Bakkaloglu, Scottsdale, AZ (US); Bhaskar Aravind, Plano, TX (US); Siew K. Hoon, Menlo Park, CA (US)

(73) Assignee: Texas Instruments Incorporated, Dallas, TX (US)

(*) Notice: Subject to any disclaimer, the term of this patent is extended or adjusted under 35 U.S.C. 154(b) by 1313 days.

(21) Appl. No.: 11/754,101

(22) Filed: May 25, 2007

(65) Prior Publication Data
US 2008/0001585 A1    Jan. 3, 2008

Related U.S. Application Data (60) Provisional application No. 60/803,212, filed on May 25, 2006.

(51) Int. Cl.
*G05F 1/10* (2006.01)

(52) U.S. Cl.
USPC .................. 323/280; 323/282; 323/284

(58) Field of Classification Search
USPC ......... 323/268, 271, 282, 285, 286, 312, 313, 323/317, 280, 284
See application file for complete search history.

(56) References Cited

U.S. PATENT DOCUMENTS

| | | | | |
|---|---|---|---|---|
| 4,138,649 A | * | 2/1979 | Schaffer | 330/9 |
| 5,202,647 A | * | 4/1993 | Muraki et al. | 331/74 |
| 6,278,320 B1 | * | 8/2001 | Vu | 327/539 |
| 6,541,948 B1 | * | 4/2003 | Wong | 323/284 |
| 6,972,974 B2 | * | 12/2005 | Inn et al. | 363/89 |
| 7,362,081 B1 | * | 4/2008 | Huang | 323/282 |
| RE41,371 E | * | 6/2010 | Van der Ploeg et al. | 341/118 |
| 2006/0229046 A1 | * | 10/2006 | Bult et al. | 455/252.1 |

OTHER PUBLICATIONS

MX Com, Inc., Mixed Signal ICs Application Note, Crystal Oscillator Circuit Design, 1997 MX Com, Inc., 3 pages.
Maxim, Dallas Semiconductor, Application 3657, Ultra-Low-Noise LDO Achieves 6nV/Hz Noise Performance, Oct. 3, 2005, 3 pages.
Chopper (Electronics), downloaded on Apr. 9, 2007, from http://en.wikipedia.org/wiki/Chopper_%28electronics%29, 2 pages.
Low dropout regulator, downloaded on Apr. 9, 2007, from http://en.wikipedia.org/wiki/Low_dropout_regulator, 1 page.
Texas Instruments, TPS718xx, TPS719xx, Dual, 200mA Output, Low Noise, High PSRR Low-Dropout Linear Regulators in 2mm×2mm SON Package, Feb. 2007, Revised Mar. 2007, 15 pages.
Wonseok Oh, Bakkaloglu, B., Bhaskar Aravind, Siew Kuok Hoon, IEEE Xplore, Release 2.3, A CMOS Low-Noise, Low-Dropout Regulator for Transceiver SOC Supply Management, International SOC Conference, 2006 IEEE, 5 pages.

* cited by examiner

*Primary Examiner* — Adolf Berhane
*Assistant Examiner* — Yemane Mehari
(74) *Attorney, Agent, or Firm* — Ronald O. Neerings; Wade James Brady; Frederick J. Telecky, Jr.

(57) ABSTRACT

Low noise, low dropout regulators are described. An example low noise, low dropout regulator includes a chopping error amplifier to receive an input signal and a feedback signal and to output a modified signal having an undesired portion of the input signal shifted to a higher frequency and a regulator to receive the modified signal and to generate an output signal by filtering the undesired portion of the input signal from the modified signal.

18 Claims, 9 Drawing Sheets

LOW NOISE, LOW DROPOUT REGULATORS

RELATED APPLICATIONS

This application claims priority from U.S. provisional application Ser. No. 60/803,212 filed May 25, 2006, which is hereby incorporated by reference in its entirety.

FIELD OF THE DISCLOSURE

This disclosure relates generally to electrical regulators and, more particularly, to low noise, low dropout regulators.

BACKGROUND

Voltage regulators receive an unregulated input voltage signal and output a substantially constant voltage signal. In other words, the voltage regulator regulates the input signal so that it can be used by other devices (e.g., cell phones, music players, voltage sensitive devices, computers, etc.). The input voltage signal and the output voltage signal may be alternating current (AC) or direct current (DC) signals. In either case, the regulator stabilizes the input signal and outputs the stabilized signal. The stabilized signal provides less noise and distortion for devices connected to the voltage regulator.

As complementary metal-oxide-semiconductor (CMOS) technology moves towards the use of deep submicron gate lengths, the amplitude of supply voltages used in analog, mixed signal, and radio frequency (RF) circuits is continuously decreasing. As the amplitude of the supply voltages decreases, the effects of noise on components fed by those supply voltages increase. For example, flicker noise (also known as 1/f noise) that occurs in semiconductor components will have a greater effect on low voltage supply signals.

Figure 1:
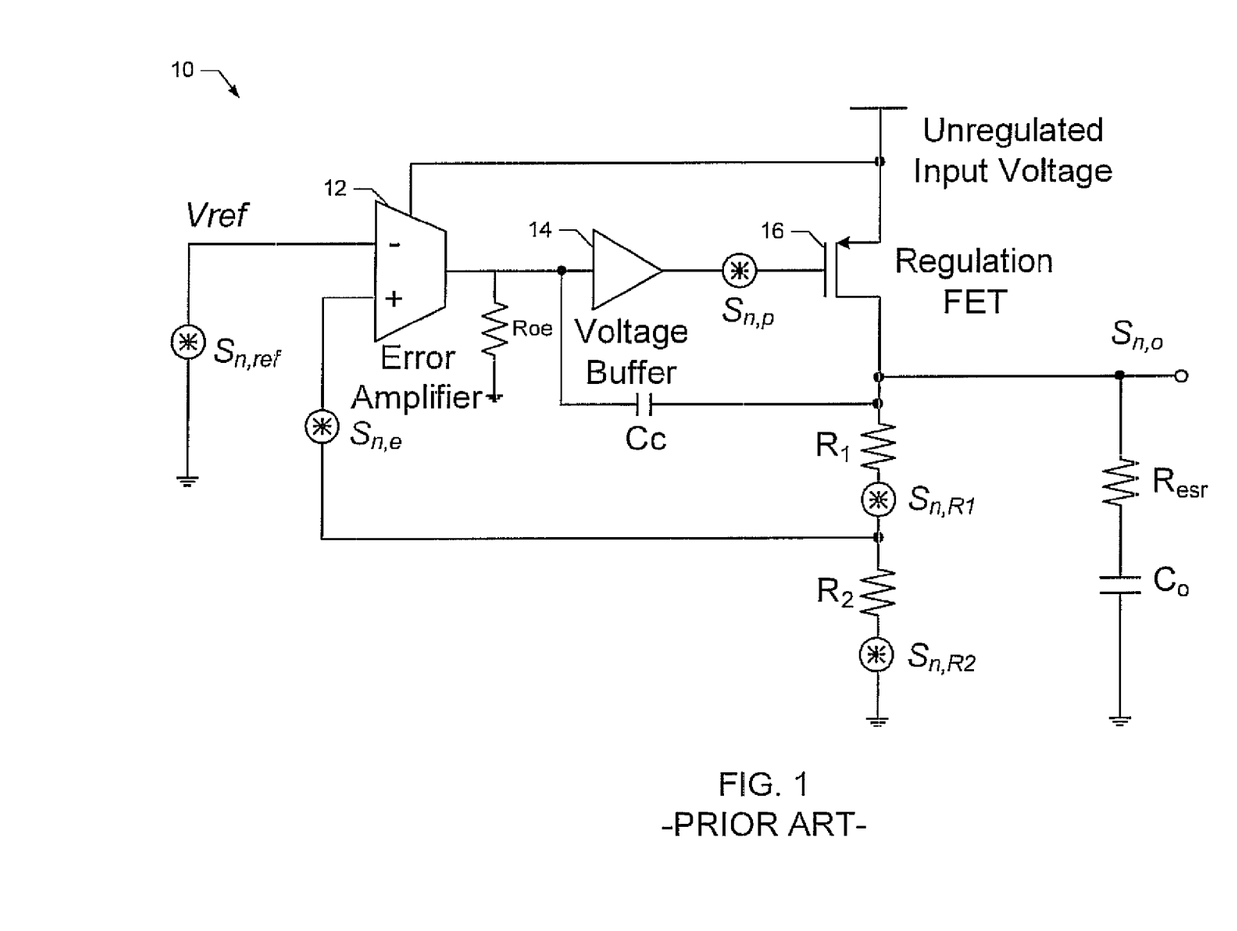
FIG. 1 is a block diagram of a typical internally compensated low dropout regulator for receiving an unregulated voltage input and outputting a regulated voltage signal.

FIG. 1 is a block diagram of a typical internally compensated low dropout regulator 10 for receiving an unregulated voltage input and outputting a regulated voltage signal. The example low dropout regulator 10 comprises an error amplifier 12 with associated output impedance Roe, a buffer amplifier 14, a regulation field effect transistor (FET) 16, a capacitor Cc, a capacitor Co, a resistor R1, a resistor R2, and a resistor Resr.

The error amplifier 12 of the illustrated example includes a negative input connected to a reference voltage Vref that includes its noise power spectral density (PSD) Sn,ref and a positive input connected to a feedback signal that includes noise PSD Sn,e. The error amplifier 12 is powered by an unregulated input voltage. The error amplifier 12 outputs an amplification of the difference between its positive input and the negative input. The output of the error amplifier 12 is connected to the resistor Roe which provides a voltage drop to a ground connection. The output of the error amplifier 12 and the resistor Roe are connected in parallel with a feedback signal provided by the capacitor Cc to the buffer amplifier 14. The buffer amplifier 14 isolates the impedance of its output from its input. The output of the buffer amplifier 14 includes the noise Sn,p. The regulation FET 16 is configured in common-source (CS) configuration. Due to its high transconductance value, input referred noise of the regulation FET 16 can usually be ignored.

The input referred noise power spectral density (PSD) of the error amplifier 12 and the buffer amplifier 14 is denoted by Sn,e(f) and the total output noise of the voltage reference is defined by Sn,ref(f). The total output noise spectral density of the low dropout regulator 10 is:

$$S_{n,o}(f) = (S_{n,ref}(f) + S_{n,e}(f))\left(1 + \frac{R_1}{R_2}\right)^2 + S_{n,R2}\left(\frac{R_1}{R_2}\right)^2 + S_{n,R1} \quad [1]$$

Assuming that the reference noise Sn,ref(f) can be suppressed by sufficient filtering, the output noise of the low dropout regulator 10 including a filter can be approximated as:

$$S_{n,o}(f) = S_{n,e}(f)\left(1 + \frac{R_1}{R_2}\right)^2 + S_{n,R2}(f)\left(\frac{R_1}{R_2}\right)^2 + S_{n,R1}(f) \quad [2]$$

As seen from equation [2], to minimize the output noise of the low dropout regulator 10, the noise contribution of the error amplifier 12 and the thermal noise contribution of the feedback network should be minimized. However, flicker noise of the error amplifier 12 becomes a dominant factor, especially for sub-micron processes at low frequencies.

The unity-gain frequency of the low dropout regulator 10 is limited by the parasitic pole generated by the output impedance of the error amplifier 12 and gate capacitance of the regulation FET 16. As shown in FIG. 1, this pole is split to a higher frequency by using the buffer amplifier 14 with low-output impedance between the error amplifier 12 and the regulation FET 16. This helps to reduce the output capacitance and improves settling time of the low dropout regulator 10.

DETAILED DESCRIPTION

Figure 2:
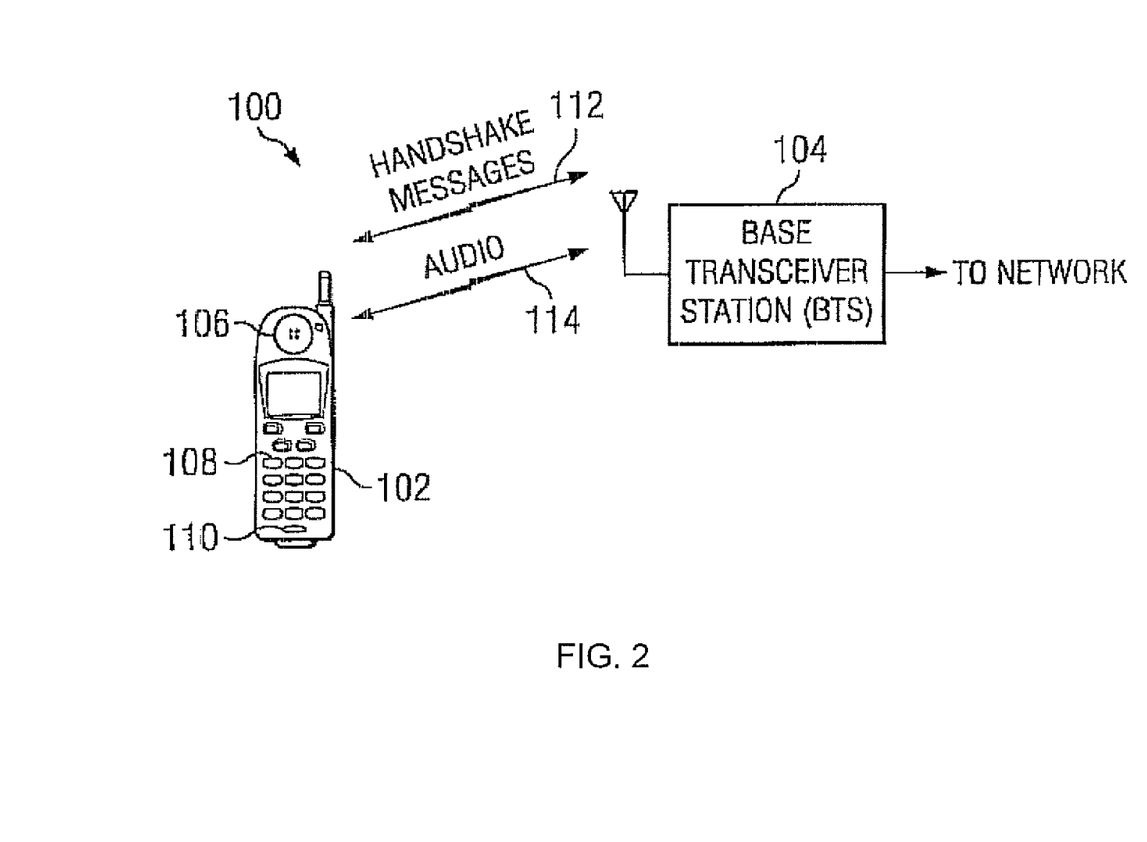
FIG. 2 is a diagram of an example system in which the disclosed low noise, low dropout regulator may be implemented.

As shown in FIG. 2, an example communication system 100 in which the low noise, low dropout regulators disclosed herein may be used includes a mobile unit 102 and infrastructure 104. The mobile unit 102 may be implemented using a cellular telephone, such as a global system for mobile communications (GSM) telephone, or any other type of telephone that may operate under the principles of frequency division multiple access (FDMA), time-division multiple access (TDMA), and/or code-division multiple access (CDMA). For example, the mobile unit 102 may operate using the advance mobile phone service (AMPS), IS-95, IS-136, or any other suitable protocol. As will be readily appreciated by those having ordinary skill in the art, the mobile unit 102 may include an earpiece speaker 106, a keypad 108, and a microphone 110 in addition to numerous other components such as communications circuits. As described below, the mobile unit 102 may also include a frequency offset control system.

The infrastructure 104 may be implemented using a base transceiver station (BTS) that is configured for wireless communications with the mobile unit 102. The infrastructure 104 may be coupled to one or more other infrastructure units, the plain old telephone system (POTS), or any other suitable network. As with the mobile unit 102, the infrastructure 104 may be implemented as a GSM base station, or as any other FDMA, TDMA, or CDMA compatible base station. In the example of FIG. 2, the communication protocols used by the mobile unit 102 and the infrastructure 104 are not important to this disclosure. Of course, the communication protocols used by the mobile unit 102 and the infrastructure 104 must be compatible for information exchange to be carried out between the mobile unit 102 and the infrastructure 104.

As described below, the mobile unit 102 may use a crystal oscillator (e.g., crystal oscillator 207 powered via the regulator 202 of FIG. 3) to generate a control frequency for allowing the mobile unit 102 to establish communications with the infrastructure 104 through the use of handshake messages 112. The handshake messages 112 may include the mobile unit 102 informing the infrastructure 104 of its presence in the area serviced by the infrastructure 104, or any other suitable communications required to make the mobile unit 102 and the infrastructure 104 compatible and ready to exchange voice and data over RF channels.

As part of the handshake messages 112 provided by the infrastructure 104, the infrastructure 104 provides a frequency control message to the mobile unit 102. For example, if the mobile unit 102 and the infrastructure 104 operate using the GSM protocol, the infrastructure provides the mobile unit 102 with a frequency control burst (FCB) on a frequency control channel (FCCH). In a known manner, the mobile unit 102 receives the FCB and calculates its frequency error. The mobile unit 102 tunes the oscillator frequency accordingly.

After the handshake messages 112 complete, and the mobile unit 102 and the infrastructure 104 are configured to exchange information, audio messages 114 may be exchanged. As will be readily appreciated by those having ordinary skill in the art, in digital communication systems, the audio messages are exchanged as sequences of encoded symbols representing bits and bytes of information that are used to reconstruct the analog audio to be exchanged. Additionally, although reference has been made to audio messages, those having ordinary skill in the art will readily recognize that data messages, video messages, and/or any other types of messages may be exchanged in the system 100 of FIG. 2.

Figure 3:
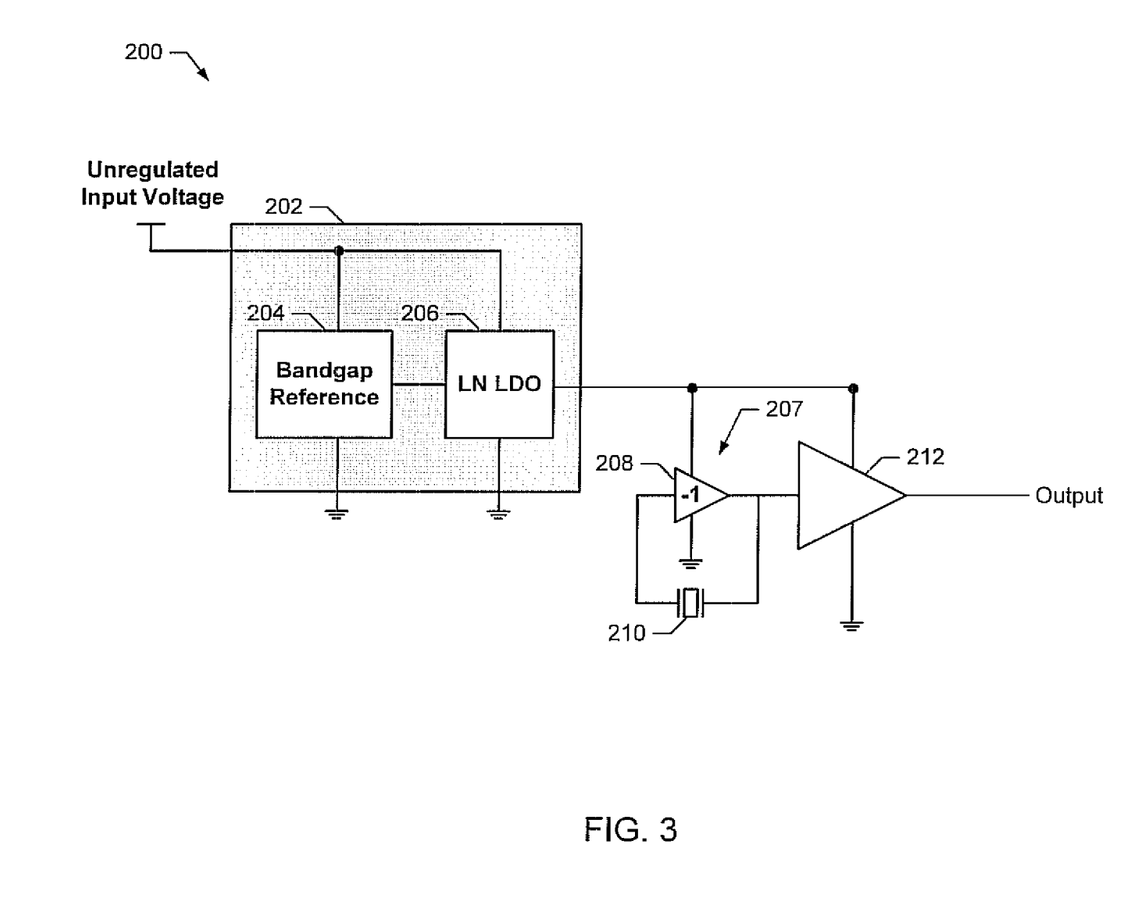
FIG. 3 is a block diagram of an example system in which the disclosed low noise, low dropout regulator is implemented.

FIG. 3 is a block diagram of an example system 200 for providing an oscillating signal (e.g., an oscillating signal for use in the mobile unit 102 of FIG. 2). The example system 200 includes the regulator 202, which includes a bandgap reference source 204 and a low noise, low dropout regulator 206, a crystal oscillator 207, which includes an inverter 208 and a crystal 210, and a buffer 212. The example system 200 is provided as one application of the low noise, low dropout regulators disclosed herein. The low noise, low dropout regulators disclosed herein may be used in other applications. For example, the low noise, low dropout regulator may be used in wired devices, signal amplification devices, etc.

The bandgap reference source 204 and the low noise, low dropout regulator 206 of the regulator 202 of the illustrated example are powered by an unregulated input voltage. The unregulated input voltage may be any voltage source such as, for example, a battery, an alternating current (AC) to direct current (DC) (AC/DC) converter, etc.

The example bandgap reference source 204 generates a substantially constant reference voltage output source. The bandgap reference 204 of the illustrated example applies a voltage difference between two diodes to a first resistor to generate a current. The current through the first resistor is used to generate a voltage in a second resistor. This voltage is added to the voltage drop of one of the diodes. If the ratio of the first resistor and the second resistor is chosen properly, the voltage output by the bandgap reference source 204 will be independent of the ambient temperature of the bandgap reference source 204. Thus, as long as the voltage and current of the unregulated input voltage meet the minimum specifications of the bandgap reference source 204, the output of the bandgap reference source 204 will be a set voltage. In other words, even if the voltage of the unregulated input voltage fluctuates, the output of the example bandgap reference source 204 will be substantially constant. However, the output of the bandgap reference source 204 may include noise introduced by the unregulated input voltage. While the bandgap reference source 204 is described as a bandgap reference source, any type of reference source may be used.

The low noise, low dropout regulator 206 of the illustrated example is powered by the unregulated input voltage and receives the output of the bandgap reference source 204. The example low noise, low dropout regulator 206 filters noise from the signal produced by the bandgap reference source 204 and outputs an output voltage. In other words, the low noise, low dropout regulator 206 regulates the output of the bandgap reference source 204 to generate a clean or noise-reduced signal. The example low noise, low dropout regulator 206 is described in further detail in conjunction with FIGS. 4-9.

The crystal oscillator 207 of the illustrated example is powered by the output of the regulator 202 (i.e., the output of the low noise, low dropout regulator 206). The crystal oscillator 207 includes the inverter gate 208 and the crystal 210. The inverter gate 208 is powered by the output of the regulator 202. The output of the crystal oscillator 207 is input to the buffer 212 that is also powered by the output of the regulator 202. By providing the inverter gate 208 and the buffer 212 with clean power, their output signals will be substantially clean as well. In one example field of use, the example crystal oscillator 207 and the example buffer 212 generate the output of the system 200 that may be used in the mobile unit 102 of FIG. 2 to provide a signal having a frequency set by the crystal oscillator 207.

While the system 200 illustrates an example crystal oscillator 207 and example buffer 212, the example regulator 202 may alternatively be coupled with any other circuitry that uses a voltage source. For example, the output of the regulator 202 may be used to power an amplifier (e.g., an audio amplifier in a personal portable audio device such as a Motion Picture Experts Ground (MPEG) layer three (MP3) player), a mixer, etc. In addition, while a simple crystal oscillator 207 is provided as an example, any type of oscillator may be powered by the output of the regulator such as, for example, a temperature controlled crystal oscillator, a digitally controlled crystal oscillator, etc.

Figure 4:
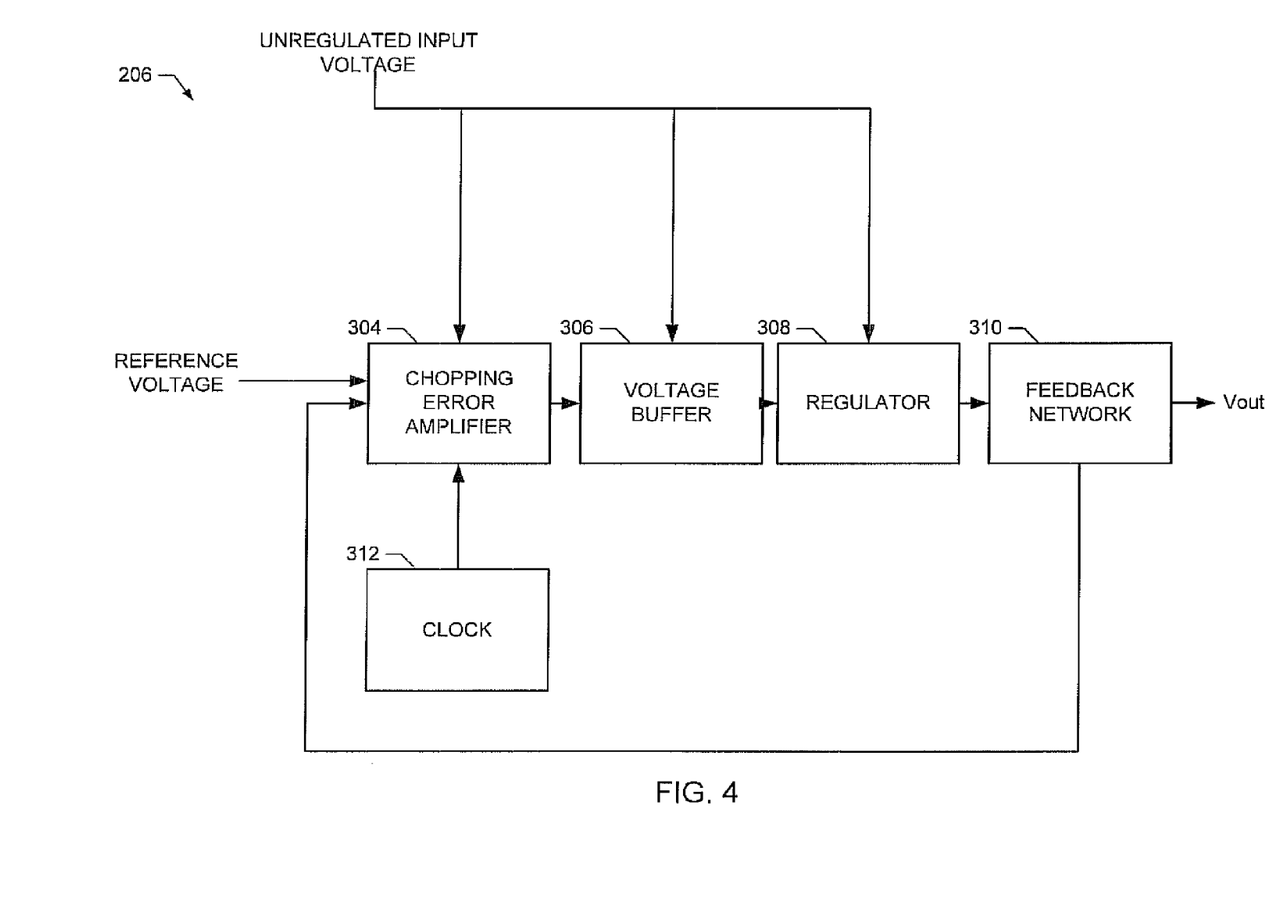
FIG. 4 is a block diagram of an example implementation of the disclosed low noise, low dropout regulator.

FIG. 4 is a block diagram of an example implementation of the example low noise, low dropout regulator 206 of FIG. 3. The example low noise, low dropout regulator 206 of FIG. 4 comprises a chopping error amplifier 304, a voltage buffer 306, a regulator 308, a feedback network 310, and a clock 312. Example schematics of implementations of the components of the low noise, low dropout regulator 206 are described in conjunction with FIGS. 7, 8, and 9.

Figure 8:
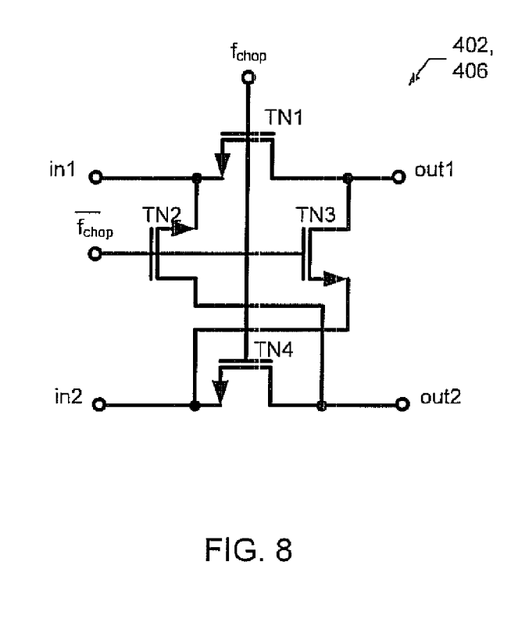
FIG. 8 is a schematic diagram of an example implementation of a chopper for use in the low noise, low dropout regulator of FIG. 6.
Figure 9:
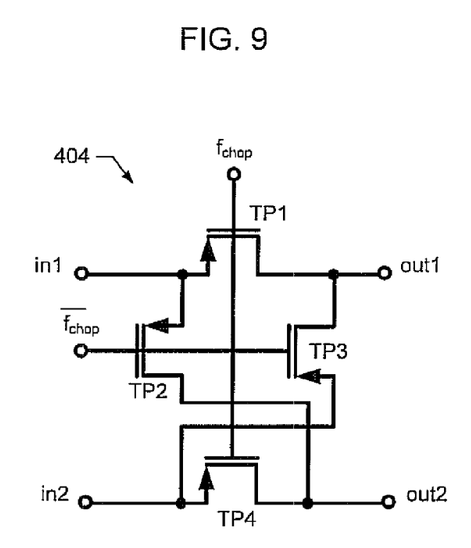
FIG. 9 is a schematic diagram of an example implementation of a chopper for use in the low noise, low dropout regulator of FIG. 6.

The chopping error amplifier 304 of the illustrated example receives a reference voltage (e.g., the output of the bandgap reference source 204 of FIG. 3) and causes low frequency noise in the signal to be shifted to high frequencies. For example, in deep-submicron processes low frequency flicker (1/frequency) noise may be introduced into the reference voltage. The chopping error amplifier 304 shifts the low frequency flicker noise to higher frequencies. The example chopping error amplifier 304 receives a clock signal from the clock 312. The clock signal is used by choppers of the chopping error amplifier 304 (as shown in FIGS. 8 and 9). In one example implementation, the frequency of the clock signal is set to the a frequency greater than the greater of twice the corner frequency of the flicker noise, which will cause the flicker noise to be upconverted without noise aliasing, and two to five times the 3 decibel (dB) bandwidth of the error amplifier, which allows the output pole of the low dropout low noise regulator 206 to provide further suppression of the flicker noise. The signal having the upconverted noise is sent to the voltage buffer 306.

The voltage buffer 306 of the illustrated example receives the signal from the chopping error amplifier 304 and subtracts power supply ripple from the signal. The voltage buffer 306 is described in further detail in conjunction with FIGS. 5 and 6. The voltage buffer 306 may be set based on the desired unity gain frequency of the low dropout regulator 206. For example, the voltage buffer 306 may have a unity gain, a gain greater than one, or a gain less than one.

The regulator 308 of the illustrated example acts as a low pass filter to the output of the voltage buffer 306. The example regulator 308 filters out the noise that has been shifted to higher frequencies by the chopping error amplifier 304. The first order pole of the example regulator 308 is set to provide desired suppression of the high frequency noise that has been upconverted by the chopping error amplifier 304. Increasing the pole frequency allows smaller circuitry components to be used in implementing the filter.

The feedback network 310 of the illustrated example includes circuitry for loading the low noise, low dropout regulator 206 (not including the actual load to which the output of the low noise, low dropout regulator 206 is applied (e.g., the crystal oscillator 207 of FIG. 3)) and for providing feedback to the chopping error amplifier 304. In the illustrated example, the feedback network 310 circuitry feeds a divided voltage back to the chopping error amplifier 304.

The clock 312 of the illustrated example provides clock signals to the chopping error amplifier 304. The example clock 312 provides three clock signals: a first clock signal, a second clock signal that is substantially identical to the first clock signal but slightly time delayed, and a third clock signal that is the inverse of the second clock signal (i.e., 180° out of phase). The clock signals from the example clock 312 may be applied to a clock control circuit to generate the three clock signals. Alternatively, two or three clocks maybe used to generate the three clock signals.

Figure 5:
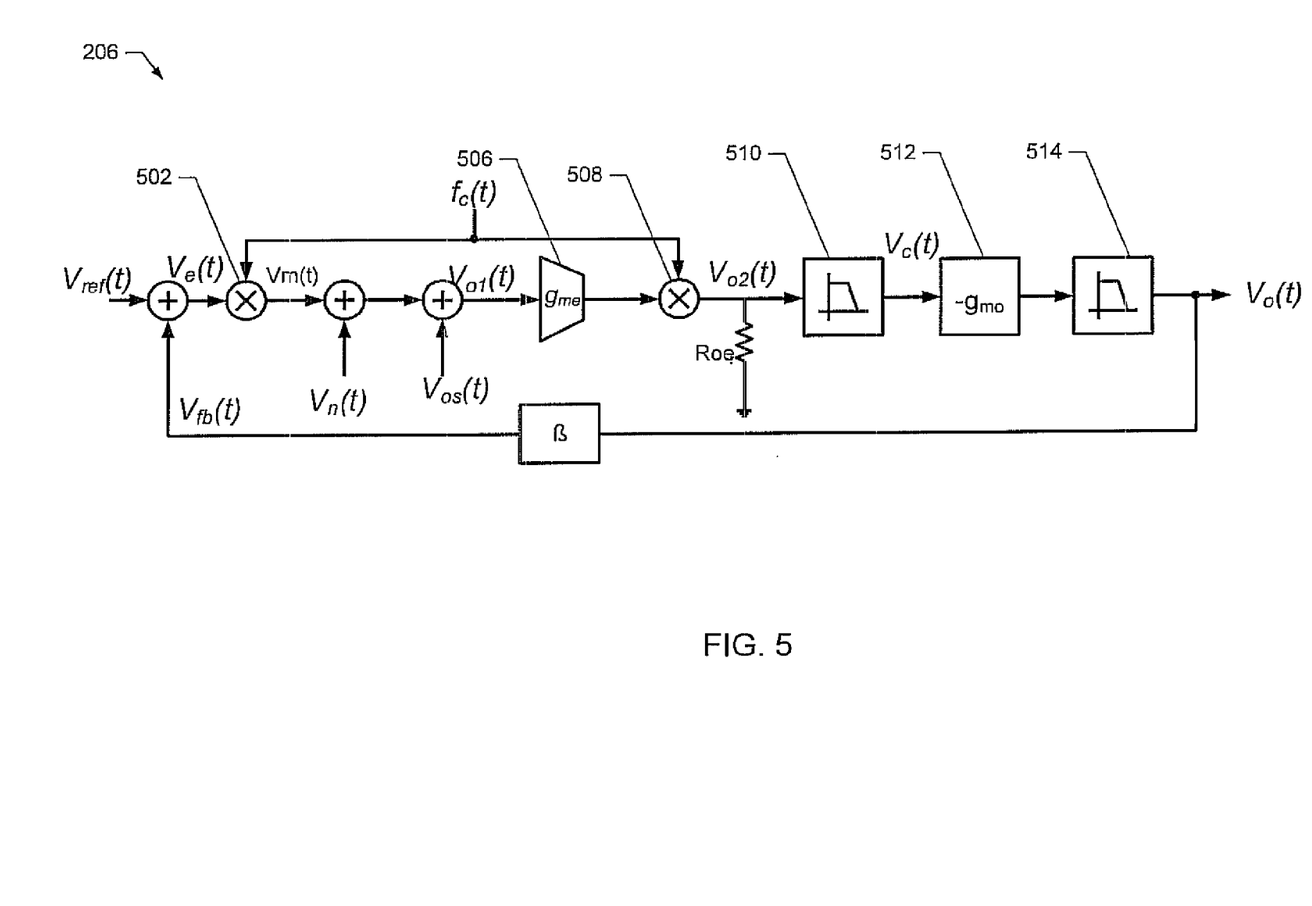
FIG. 5 is a system diagram of an example implementation of the low noise, low dropout regulator of FIG. 3 and/or FIG. 4.

FIG. 5 is a system diagram of an example implementation of the low noise, low dropout regulator 206 of FIG. 3 and/or FIG. 4. The low noise, low dropout regulator 206 of FIG. 5 comprises a first chopper 502, a amplifier 506, a second chopper 508, a resistor Roe, a first filter 510, a regulator FET 512, a second filter 514, and a feedback gain β.

Vref(t) is an input reference voltage (e.g., a reference voltage from the bandgap reference 204 of FIG. 2) and Vfb(t) is a feedback signal, which is equal to the output voltage Vo(t) multiplied by the feedback gain β. Vref(t) and Vfb(t) are subtracted to obtain the error between the two signals Ve(t) which is defined as:

$$V_e(t) = V_{ref} - \beta V_o(t). \quad [3]$$

The first chopper 502 receives the error signal Ve(t) and transposes the error signal to odd harmonics of a modulation signal fc(t) (e.g., the clock signal from the clock 312 of FIG. 3). An input referred noise signal Vn(t) (e.g., flicker noise) and an input referred offset signal Vos(t) (e.g., DC offset) are added to the output of the first chopper 502 to generate the signal Vo1(t). The amplifier 506 receives the signal Vo1(t) and amplifies the signal by a factor of gie×Roe. The output of the amplifier 506 is then modulated by the second chopper 508.

The output of the second chopper 508 is Vo2(t). The second chopper 508 causes the input referred noise signal Vn(t) and the input referred offset signal Vos(t) to be transposed to higher harmonics of the modulation signal fc(t) while the error signal Ve(t) that was up-converted by the first chopper 502 is down-converted to baseband. The signal Vo2(t) is applied across the resistor Roe, which is connected to a ground connection. The signal Vo2(t) is defined as:

$$V_{o2}(t) = A_e \left[ V_e(t) + \sum_{k=-\infty}^{\infty} \left\{ \frac{2[V_n(t) + V_{os}(t)]e^{j2\pi(2k+1)f_c t}}{j(2k+1)\pi} \right\} \right], \quad [4]$$

The power spectral density of the signal Vo2(t) can be represented by:

$$S_{o2}(f) = \quad [5]$$

$$|A_e(f)|^2 \left[ S_e(f) + \sum_{k=-\infty}^{\infty} \left\{ \frac{4[S_n(f + (2k+1)f_c) + S_{os}(f + (2k+1)f_c)]}{(2k+1)^2 \pi^2} \right\} \right],$$

where Ae(f) represents the periodic small signal AC response of the amplifier 506, Se(f) is the power spectral density of the signal Ve(t), Sn(f) is the power spectral density of the signal Vn(t), and Sos(f) is the power spectral density of the signal Vos(t).

The signal Vo2(t) is input to a first filter 510. The first filter 510 of the illustrated example is a Miller compensation low pass filter, however, a dedicated filter may be used. The first filter 510 filters the input referred noise signal Vn(t) and the input referred offset signal Vos(t) that were transposed to high frequencies by the second chopper 508. The output of the first filter is labeled as control signal Vc(t). The control signal Vc(t) is input to the regulator FET 512. The transconductance of the regulator FET 512 causes a negative amplification by a factor of gmo×$R_L$. The output of the regulator FET 512 is input to the second filter 514. The second filter 514 of the illustrated example is implemented as an output capacitor that causes a further low pass filtering, however, any type of filter may be used. The output of the second filter 514 is output signal Vo(t) that is applied to the load (e.g., the crystal oscillator 207 of FIG. 3) and is also the signal that is the feedback signal before the feedback gain P is applied. The output signal Vo(t) has a power spectral density of:

$$|S_o(f)| \approx |A_e(f)|^2 S_e(f)|g_{mo}Z_o(f)|^2, \qquad [6]$$

where Zo(f) is the total impedance of the load applied to the low noise, low dropout regulator 206.

In the low noise, low dropout regulator illustrated in FIG. 5, the modulation signal fc(t) is set to have a frequency that is three times the error amplifier cutoff frequency as a trade-off between error amplification and noise suppression.

Figure 6:
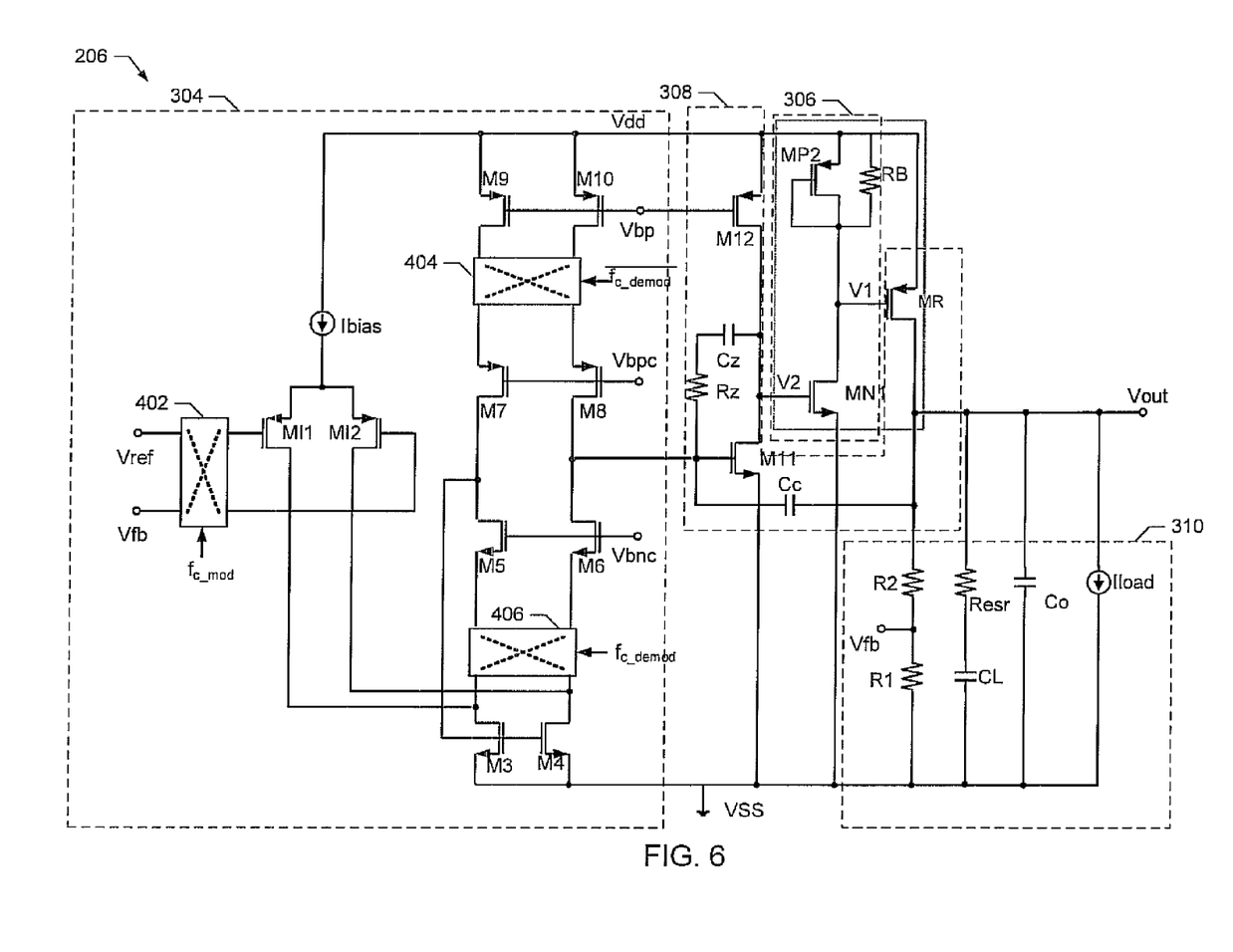
FIG. 6 is a schematic diagram of an example implementation of the disclosed low noise, low dropout regulator.

FIG. 6 is a schematic of an example implementation of the low noise, low dropout regular 206 of FIGS. 3, 4, and/or 5. The low noise, low dropout regulator 206 of the illustrated example includes the chopping error amplifier 304, the voltage buffer 304, the regulator 308, and the feedback network 310.

The chopping error amplifier 304 of the illustrated example includes choppers 402, 404, and 406; transistors MI1, MI2 M3, M4, M5, M6, M7, M8, M9, and M10; and current source Tbias. Example implementations of the chopper 402, the chopper 404, and the chopper 406 described in conjunction with FIGS. 5 and 9. The transistors of the illustrated example are implemented by either P channel or N channel metal oxide semiconductor field effect transistors (CMOS and NMOS respectively). Alternatively, other types of transistors such as bipolar junction transistors may be used in other implementations.

The chopping error amplifier 304 of FIG. 4 provides two choppers (the chopper 404 and the chopper 406) embedded between the low-impedance nodes of a folded cascade amplifier. The chopper 404 and the chopper 406 use opposite clock phases to provide a valid signal at both clock edges. The chopping error amplifier 304 causes offset and noise from the rail devices (the transistors M3, M4, M9, and M10) to be shifted to high frequencies. The chopping error amplifier 304 receives clock signals (e.g. from the clock 312 of FIG. 4). The clock signals to the chopper 404 and the chopper 406 are delayed with respect to the clock signal to the chopper 402 allows the amplifier to settle reducing residual voltage ripple at the output of the chopping error amplifier 304. While the clock signals fc_demod and $\overline{\text{fc\_demod}}$ have been described as delayed versions of fc_mod, the failing edges of clock signals fc_demod and $\overline{\text{fc\_demod}}$ may alternatively be aligned with the falling edges of the clock signal fc_mod while the rising edges of fc_demod and $\overline{\text{fc\_demod}}$ are delayed after the rising edge of fc_mod.

The chopper 402 of the illustrated example receives a reference voltage Vref (e.g., the output of the bandgap reference source 204) and a feedback voltage Vfb from the load 308. The example chopper also receives a clock signal fc_mod (e.g., a clock signal from the clock 312). The example chopper 402 outputs the Vref to a gate of the transistor MI1 and Vfb to a gate of the transistor MI2 when the clock signal is high and outputs Vfb to the gate of the transistor MI1 and Vref to the gate of the transistor MI2 when the clock signal is low. Any difference between Vref and Vfb results in an AC signal between the outputs of the chopper 402 at the frequency of fc_mod.

The current source Ibias is connected between the input voltage Vdd (e.g., the input voltage from the unregulated voltage source illustrated in FIG. 3) and a drain of the transistor MI1 and a drain of the transistor MI2. The output of the chopper 402 causes current from the current source Ibias to flow through the transistor MI1 and the transistor MI2 to the chopper 406 input. When both outputs of the chopper 402 are at the same potential, one half of the current from the current source Ibias flows through the transistor MI1 and one half of the current from the current source Ibias flows through the transistor MI2. The source of the transistor MI1 is connected to a first input to the chopper 406 and a drain of the transistor M3. The source of the transistor M12 is connected to a second input to the chopper 406 and a drain of the transistor M4.

The transistor M3 includes a gate that is connected to a gate of the transistor M4, a drain of the transistor M5 and a drain of the transistor M7. In addition, the transistor M3 includes a source that is connected to a ground potential VSS or if the circuit is connected to a different source, a base potential VSS for the circuit. The transistor M4 also includes a source that is connected to the ground potential VSS or the base potential VSS. As the current to the gates of the transistor M3 and the transistor M4 increases, more current is allowed to flow through the transistors to the ground potential VSS, thereby reducing the current that flows to the chopper 406.

The output of the chopper 406 is connected to a source of the transistor M5 and a source of the transistor M6. The transistor M5 and the transistor M6 each include a gate that is connected to the negative terminal of a voltage bias network. An example voltage bias network is described in conjunction with FIG. 7. A drain of the transistor M6 is connected to a drain of the transistor M8 and the regulator 308.

Figure 7:
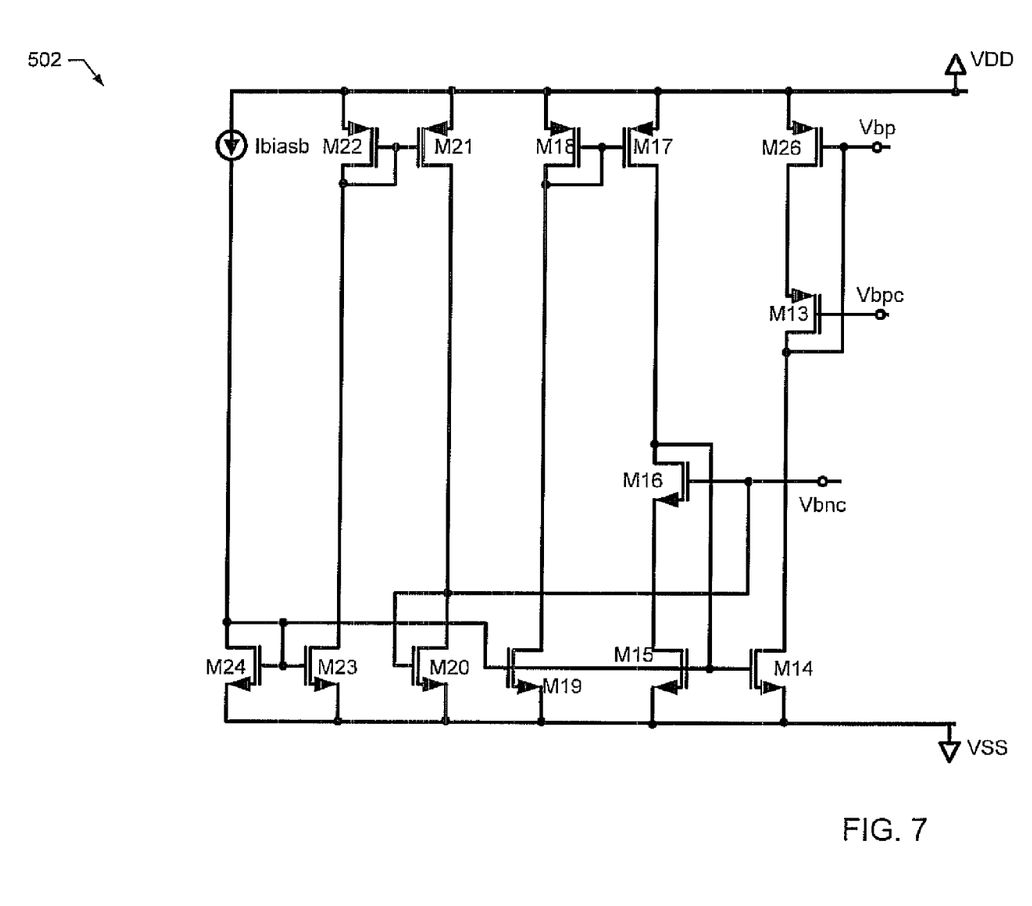
FIG. 7 is a schematic diagram of an example implementation of a bias network for use in the low noise, low dropout regulator.

The transistor M7 also includes a source connected to the output of the chopper 404 and a gate connected to a gate of the transistor M8 and a positive terminal of the voltage bias network (e.g., the voltage bias network illustrated in FIG. 7). The transistor M8 includes a source connected to the output of the chopper 404.

The inputs of the chopper 404 are connected to a drain of the transistor M9 and a drain of the transistor M10 respectively. The chopper 404 receives a clock signal $\overline{\text{fc\_demod}}$ (e.g., from the clock 312 of FIG. 4), which is the inverse of the clock signal fc_demod provided to the chopper 406.

The transistor M9 includes a source connected to the input voltage VDD and a gate connected to a gate of the transistor M10 and the bias network (e.g., the bias network illustrated in FIG. 7). The transistor M10 includes a source connected to the input voltage VDD.

The voltage buffer 306 of the illustrated example includes a transistor MP2, a resistor RB, and a transistor MN1.

Transistor MP2 is diode-connected and includes a source connected to the input voltage VDD and a drain connected to the resistor RB, the regulator 308 and a drain of the transistor MN1. The remaining lead of the resistor RB is connected to the input voltage VDD. The transistor MN1 also includes a gate connected to the regulator 308 and a source connected to the ground potential VSS or the base potential VSS.

The regulator 308 of the illustrated example includes a transistor M12, a capacitor Cz, a resistor Rz, a transistor M11, a capacitor Cc, and a transistor MR.

The transistor M12 includes a source connected to the input voltage VDD, a gate connected to the bias network, and a drain connected to the capacitor Cz, a drain of the transistor M11, and the voltage buffer 306. The capacitor Cz is connected to the resistor Rz, which is connected to a gate of the transistor M11, the capacitor Cc, and the input to the regulator 308 from the chopping error amplifier 304. The transistor M11 includes a source that is connected to the ground potential VSS. The capacitor Cc is also connected to a drain of the transistor MR and the feedback network 310. The capacitor Cc acts as a short between the Output of the chopping error amplifier 304 and the load at high frequencies. The capacitor Cz acts as a short for high frequencies and an open circuit to low frequencies causing the bias current into the gate of the transistor M11 to be increased at high frequencies, which allows current to flow to the ground potential VSS reducing the current flowing into the gate of the transistor MN1. By setting the output pole of the regulator to between one fifth and one tenth of the frequency of fc_mod will provide suppression of the 1/f flicker noise.

The feedback network 310 of the illustrated example includes a resistor R1, a resistor R2, a resistor Resr, a capacitor CL, a capacitor Co, and a current source Iload representative of the current from the actual load applied to the circuit (e.g., the crystal oscillator 207 of FIG. 3).

The resistor R2 is connected between the output of the regulator 308 and the resistor R1 and the feedback connection for Vfb. The remaining connection of the resistor R1 is connected to the ground potential VSS. The resistor Resr is connected between the output of the regulator 308 and the capacitor CL. The remaining connection of the capacitor CL is connected to the ground potential VSS. The capacitor Co is connected between the output of the regulator 308 and the ground potential VSS. The resistor R2 and R1 implement a voltage divider for the feedback connection Vfb, which causes the feedback signal to be a factor of the output signal Vout.

FIG. 7 is an example schematic of a circuit 502 for implementing a bias network for biasing the transistors of low noise, low dropout regulator 206 illustrated in FIG. 3. The example circuit 502 includes transistors M13, M14, M15, M16, M17, M18, M19, M20, M21, M22, M23, M24, and M26 and current source Ibiasb. The example circuit 502 attaches to nodes Vbp, Vbpc, and Vbnc and the input voltage VDD and the ground potential VSS.

The transistor M13 includes a source connected to the drain of the transistor M26, a gate connected to the positive terminal of bias circuit 502 Vbpc, and a drain connected to the gate of the transistor M26, the bias connection Vbp, and the drain of the transistor M14. Transistor M14 includes a source connected to the ground potential VSS and a gate connected to a drain of the transistor M16, a drain of the transistor M17, a gate of transistor M15, a gate of transistor M19, tae gate of transistor M23, and a gate and a drain of transistor M24, and the current source Ibiasb. Transistor M26 includes a source connected to the input voltage VDD.

The transistor M16 includes a gate connected to the negative terminal of the bias circuit 502 Vbnc, a drain of the transistor M20, and a gate of the transistor M20. The transistor M15 includes a source connected to the ground potential VSS. The transistor M17 includes a source connected to the input voltage VDD and a gate connected to a gate and a drain of transistor M18 and a drain of transistor M19. Transistor M18 includes a source connected to the input voltage VDD. Transistor M17 is configured as a current mirror of transistor M18. Transistor M19 includes a source connected to the ground potential VSS.

Transistor M21 includes a source connected to the input voltage VDD and a gate connected to a gate aid a drain of the transistor M22 and drain of the transistor M23. The transistor M22 includes a source connected to the input voltage VDD. The transistor M21 is configured as a current mirror of the transistor M22. Transistor M20 includes a source connected to the ground potential VSS. Transistor M23 includes a source connected to the ground potential VSS. Transistor M24 includes a source connected to the ground potential VSS.

FIG. 8 is an example schematic of a circuit for implementing the chopper 402 and/or the chopper 406 of FIG. 6. The example chopper includes transistors TN1, TN2, TN3, and TN4.

The transistor TN1 includes a gate connected to the input clock signal fchop, a source connected to a first input in1 and a source of the transistor TN2, and a drain connected to a first output out1 and a drain of the transistor TN3. The transistor TN2 includes a gate connected to the inverse of the input clock signal $\overline{fchop}$ (e.g., the chopper 402 and/or the chopper 406 may include an inverter to invert the fchop signal or may receive the fchop signal and the $\overline{fchop}$ signal) and a drain connected to a second output out2. The transistor TN3 includes a gate connected to the $\overline{fchop}$ signal, a drain connected to the first output out1, and a source connected to a second input in2. The transistor TN4 includes a gate connected to the fchop signal, a source connected to the second input in2, and a drain connected to the second output out2.

FIG. 9 is an example schematic of a circuit for implementing the chopper 404 of FIG. 6. The example chopper includes transistors TP1, TP2, TP3, and TP4.

The transistor TP1 includes a gate connected to the input clock signal fchop, a source connected to a first input in1 and a source of the transistor TP2, and a drain connected to a first output out1 and a drain of the transistor TP3. The transistor TP2 includes a gate connected to the inverse of the input clock signal $\overline{fchop}$ (e.g., the chopper 404 may include an inverter to invert the fchop signal or may receive the fchop signal and the $\overline{fchop}$ signal) and a drain connected to a second output out2. The transistor TP3 includes a gate connected to the $\overline{fchop}$ signal, a drain connected to the first output out1, and a source connected to a second input in2. The transistor TP4 includes a gate connected to the fchop signal, a source connected to the second input in2, and a drain connected to the second output out2.

Figure 10:
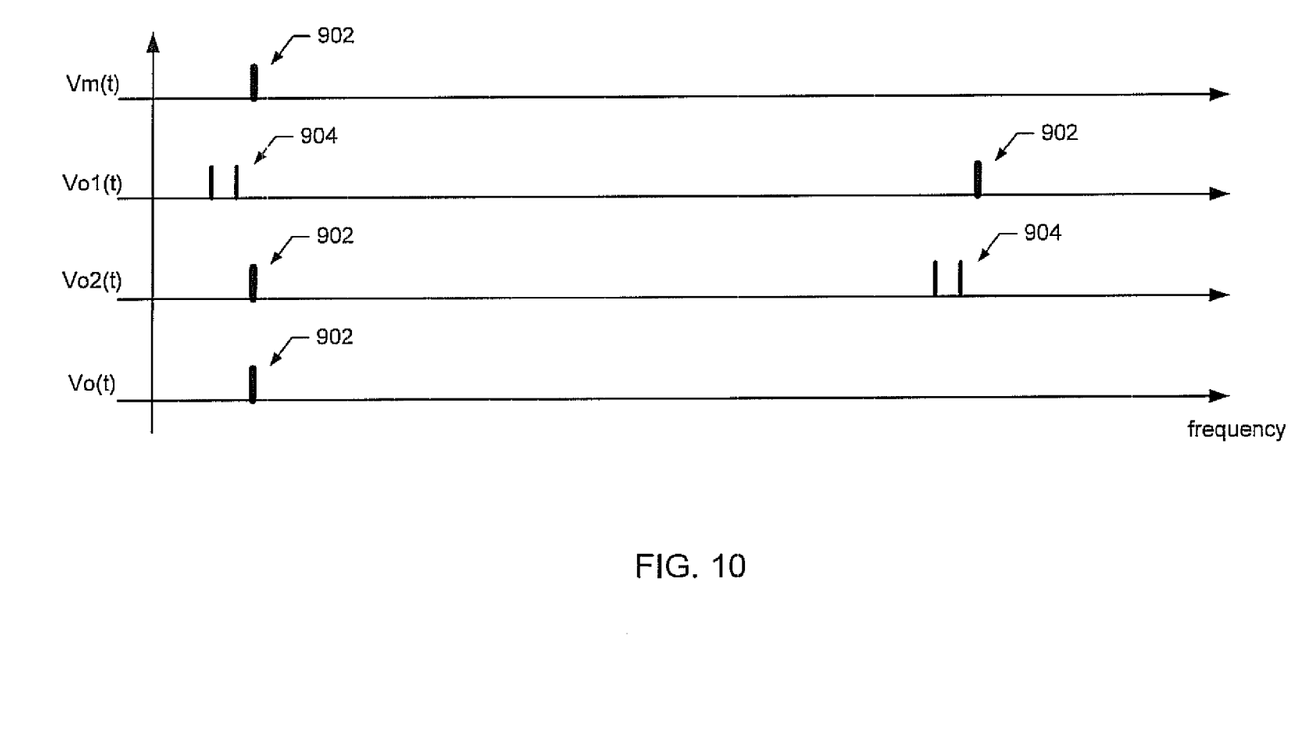
FIG. 10 is a chart illustrated various signals of FIG. 5.

FIG. 10 is a chart illustrating various signals of FIG. 5. In particular, the chart of FIG. 10 illustrates the frequency domain of the signals Vm(t), Vo1(t), Vo2(t), and Vo(t). Of course, the chart of FIG. 10 is illustration and is not intended to exactly represent the relative magnitudes or frequencies of actual signals.

The chart illustrated in FIG. 10 shows a first element 902 for Vm(t) at a relatively low frequency. The first element 902 corresponds to the difference between the reference signal Vref(t) and the feedback signal Vfb(t). As shown in Vo1(t), the first chopper 502 has caused the first element 902 to be transposed to a higher frequency and noise element 904 has been introduced, The signal Vo2(t) shows that after the second chopper 508 the noise element 904 has been transposed to higher frequencies and the first element 902 has been returned to baseband frequencies. Lastly, the signal Vo(t) shows that after the first filter 510 and the second filter 514, the high frequency noise element 904 has been filtered from the signal leaving only the first element 902 at baseband frequencies.

From the foregoing, persons of ordinary skill in the art will appreciate that the above disclosed methods and apparatus may be realized within a single device or using two or more cooperating devices, and could be implemented by software, hardware, and/or firmware to implement a spindle motor controller disclosed herein.

Although certain example methods, apparatus, and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:
1. A low noise, low dropout regulator comprising:
a chopping error amplifier to receive a reference signal and a feedback signal, to determine the difference between the reference signal and the feedback signal, and to output a modified signal having an undesired portion of the difference between the reference signal and the feedback signal shifted to a higher frequency; and a regulator to receive the modified signal and to generate an output signal by filtering the undesired portion of the input signal from the modified signal.

2. A low noise, low dropout regulator as defined in claim 1, wherein the chopping error amplifier is further to receive a clock signal.

3. A low noise, low dropout regulator as defined in claim 2, wherein the clock signal is a first clock signal and the chopping error amplifier is further to receive a second clock signal.

4. A low noise, low dropout regulator as defined in claim 1, wherein the chopping error amplifier is further to amplify the difference between the reference signal and the feedback signal.

5. A low noise, low dropout regulator as defined in claim 1, wherein filtering the undesired portion of the input signal comprises low pass filtering the modified signal to attenuate the undesired portion of the input signal.

6. A low noise, low dropout regulator as defined in claim 1, wherein the undesired portion of the input signal comprises noise.

7. A low noise, low dropout regulator as defined in claim 6, wherein the noise is flicker noise.

8. A low noise, low dropout regulator as defined in claim 1, wherein the regulator is a power regulator.

9. A low noise, low dropout regulator as defined in claim 1, wherein the chopping error amplifier comprises a chopper to receive the feedback signal and the reference signal.

10. A low noise, low dropout regulator as defined in claim 1, wherein the reference signal is a reference signal from a bandgap reference source.

11. A low noise, low dropout regulator as defined in claim 1, further comprising a voltage buffer to remove power supply ripple from the input signal to generate a clean supply signal and to supply the clean supply signal to the regulator.

12. A low noise, low dropout regulator as defined in claim 1, further comprising a feedback network to divide the voltage of the output signal to generate the feedback signal.

13. A low noise, low dropout regulator comprising:
a chopping error amplifier to receive a reference signal and a feedback signal, to determine the difference between the reference signal and the feedback signal, and to output a modified signal having an undesired portion of the difference between the reference signal and the feedback signal shifted to a higher frequency;
a regulator to receive the modified signal and to generate an output signal by filtering the undesired portion of the input signal from the modified signal;
wherein the chopping error amplifier comprises a chopper to receive the feedback signal and the reference signal; and
wherein a frequency of a clock signal applied to the chopper is greater than twice the corner frequency of a flicker noise.

14. A system comprising:
a bandgap reference source to receive an input signal and to generate a reference signal;
a chopping error amplifier to receive the reference signal and a feedback signal, to amplify the difference between the reference signal and the feedback signal, and to receive the input signal and to shift an undesired portion of the input signal to a higher frequency;
a regulator to receive the amplified signal and the shifted signal and to attenuate the shifted signal and to output an output signal;
a crystal oscillator to receive the output signal as a supply signal.

15. A system as defined in claim 14, wherein the output signal powers an inverter in the crystal oscillator.

16. A system as defined in claim 14, further comprising a battery to supply the input signal.

17. A low noise, low dropout regulator comprising:
a first chopper to receive a reference signal and a feedback signal and to output a chopped signal;
a N channel metal oxide semiconductor (NMOS) mixer to receive the chopped signal and to supply a proportionate current as a mixed output;
a folded cascode amplifier to receive the mixed output and to amplify the mixed output;
a second chopper embedded between low impedance nodes of the folded cascode amplifier;
a third chopper embedded between the low impedance nodes of the folded cascode amplifier;
a bias network to provide bias signals to NMOS transistors of the folded cascode amplifier;
a resistor capacitor (RC) filter to low pass filter the output of the folded cascode amplifier;
a diode connected P channel metal oxide semiconductor (PMOS) transistor; and
a PMOS transistor to receive the output of the folded cascode amplifier and to output a regulated output signal.

18. A low noise, low dropout regulator as defined in claim 17, further comprising a resistor divider network to divide the output signal to generate the feedback signal.

* * * * *